US012423502B2

United States Patent
Liang et al.

(10) Patent No.: US 12,423,502 B2
(45) Date of Patent: Sep. 23, 2025

(54) RULE CHECK HEATMAP PREDICTION

(71) Applicant: INTERNATIONAL BUSINESS MACHINES CORPORATION, Armonk, NY (US)

(72) Inventors: Rongjian Liang, College Station, TX (US); Hua Xiang, Ossining, NY (US); Jinwook Jung, Somers, NY (US); Gi-Joon Nam, Chappaqua, NY (US); Lakshmi N. Reddy, Mount Kisco, NY (US); Shyam Ramji, LaGrange, NY (US); Diwesh Pandey, Jeevan Bhima Nagar (IN); Gustavo Enrique Tellez, Hyde Park, NY (US)

(73) Assignee: International Business Machines Corporation, Armonk, NY (US)

( * ) Notice: Subject to any disclaimer, the term of this patent is extended or adjusted under 35 U.S.C. 154(b) by 680 days.

(21) Appl. No.: 17/650,656

(22) Filed: Feb. 10, 2022

(65) Prior Publication Data

US 2023/0252217 A1    Aug. 10, 2023

(51) Int. Cl.
*G06F 30/398*    (2020.01)
*G06F 30/394*    (2020.01)
*G06N 3/08*    (2023.01)

(52) U.S. Cl.
CPC .......... *G06F 30/398* (2020.01); *G06F 30/394* (2020.01); *G06N 3/08* (2013.01)

(58) Field of Classification Search
CPC ...... G06F 30/398; G06F 30/33; G06F 30/392; G06F 30/30; G06F 30/394; G06F 30/27; G06F 30/3308; G06F 30/367; G06F 30/39; G06F 2111/04; G06F 30/327; G06F 2111/08; G06F 2119/12; G06F 11/261; G06F 2111/20; G06F 2119/06; G06F 11/079; G06F 30/20; G06F 30/337; G06F 30/323; G06F 2111/12; G06F 2119/18; G06F 30/373; G06F 30/32; G06F 30/3323; G06F 30/331; G03F 1/70; G03F 1/36; G03F 7/70441; G03F 1/72; G06N 20/00
USPC .................................................. 716/100–106
See application file for complete search history.

(56) References Cited

U.S. PATENT DOCUMENTS

| | | | |
|---|---|---|---|
| 7,886,243 B1 | 2/2011 | Gumaste et al. | |
| 10,755,026 B1 * | 8/2020 | Luo | G06N 3/045 |
| 10,783,311 B2 | 9/2020 | Strudders | |
| 2020/0104457 A1 * | 4/2020 | Chuang | G06F 30/392 |
| 2021/0073456 A1 * | 3/2021 | Nath | G06N 5/01 |

OTHER PUBLICATIONS

Kopp et al., "Decision Analytics with Heatmap Visualization for Multi-step Ensemble Data", Bise, Research Paper, Institute for Business Information Systems, Leibniz University Hannover, Germany, 2014, DOI 10.1007/s12599-014-0326-4, (pp. 13).
CGMA Tools, "How to communicate risks using a heat map", Chartered Global Management Accountant, American Institute of CPAs, Jan. 2012, (pp. 9).

(Continued)

*Primary Examiner* — Binh C Tat
(74) *Attorney, Agent, or Firm* — Jared C. Chaney

(57) ABSTRACT

Design rule violations ("DRVs") may be predicted using a design rule check ("DRC") density map during a physical synthesis operation prior to executing a routing operation.

20 Claims, 14 Drawing Sheets

(56) References Cited

OTHER PUBLICATIONS

Fakhry et al., "Applying maching learning to pattern analysis for automated in-design layout optimization", Conference Paper, Mar. 2018, (pp. 9).

Anonymous, "Optimizing Route Guidance to Preserve User Loyalty", IPCOM000252346D, Jan. 2018, (pp. 34).

Anonymous, "Multi-criteria Approach to Planning and Scheduling Through Criticism and Repair", IPCOM000233777D, Dec. 2013, (pp. 7).

Chan, et al. "Routability Optimization for Industrial Designs at Sub-14nm Process Nodes Using Machine Learning", ACM International Symposium on Physical Design, Mar. 19, 2017, pp. 15-21.

Chen, et al., "A Learning- Based Methodology for Routability Prediction in Placement", IEEE International Symposium on VLSI Design, Automation and Test, Apr. 2018, 4 pages.

Hung, et al.,"Transforming global routing report into DRC violation map with convolutional neural network," ACM International Symposium on Physical Design, Mar. 30, 2020, pp. 57-64.

Islam, et al., "Late Breaking Results: Predicting DRC Violations Using Ensemble Random Forest Algorithm," ACM/IEEE Design Automation Conference, Jun. 2, 2019, 3 pages.

Liang, et al., "DRC Hotspot Prediction at Sub-10nm Process Nodes Using Customized Convolutional Network," ACM International Symposium on Physical Design, Mar. 30, 2020, pp. 135-142.

Tabrizi, et al. "A Machine Learning Framework to Identify Detailed Routing Short Violations From a Placed Netlist", 2018 ACM/IEEE Design Automation Conference, Jun. 24, 2018, Article No. 48, 6 pages.

Xie, et al., "RouteNet: Routability Prediction for Mixed-Size Designs Using Convolutional Neural Network", IEEE/ACM International Conference on Computer-Aided Design, Nov. 5-8, 2018, 8 pages.

Yu, et al. "Pin Accessibility Prediction and Optimization With Deep Learning-Based Pin Pattern Recognition", ACM/IEEE Design Automation Conference, Jun. 2, 2019, 6 pages.

Yu, et al. "Lookahead Placement Optimization With Cell Library-Based Pin Accessibility Prediction via Active Learning," ACM International Symposium on Physical Design, Mar. 30, 2020, pp. 65-72.

* cited by examiner

| METHOD | LABEL | PREDICTION RESULT | | | ACCURACY |
|---|---|---|---|---|---|
| | | 0 | 1 | 2 | |
| J-NET MULTI-CLASS CLASSIFIER | 0 | 1102471 | 71549 | 3032 | 94% |
| | 1 | 12921 | 15708 | 1229 | 53% |
| | 2 | 5437 | 858 | 4295 | 41% |
| | | | | average | 63% |
| J-NET PLUS | 0 | 1102472 | 71831 | 2749 | 94% |
| | 1 | 7571 | 20762 | 1525 | 70% |
| | 2 | 169 | 4063 | 6358 | 60% |
| | | | | average | 75% |

CLASS 0: #DRV < 2; CLASS 1: 2 ≤ #DRV < 6; CLASS 2: 6 ≤ #DRV

FIG. 11

RULE CHECK HEATMAP PREDICTION

BACKGROUND

The present invention relates in general to computing systems, and more particularly, to various embodiments for providing design rule check violations prediction of an integrated circuit using a computing processor.

SUMMARY

According to an embodiment of the present invention, a method for providing design rule check violations prediction of an integrated circuit in a computing environment, by one or more processors, in a computing system. One or more design rule violations ("DRVs") may be predicted using a design rule check ("DRC") density map during a physical synthesis operation prior to executing a routing operation.

An embodiment includes a computer usable program product. The computer usable program product includes a computer-readable storage device, and program instructions stored on the storage device.

An embodiment includes a computer system. The computer system includes a processor, a computer-readable memory, and a computer-readable storage device, and program instructions stored on the storage device for execution by the processor via the memory.

Thus, in addition to the foregoing exemplary method embodiments, other exemplary system and computer product embodiments are provided.

BRIEF DESCRIPTION OF THE DRAWINGS

FIG. 11 is diagram depicting a table of prediction result from providing design rule check violations prediction of an integrated circuit in which aspects of the present invention may be realized.

DETAILED DESCRIPTION OF THE DRAWINGS

Figure 1:
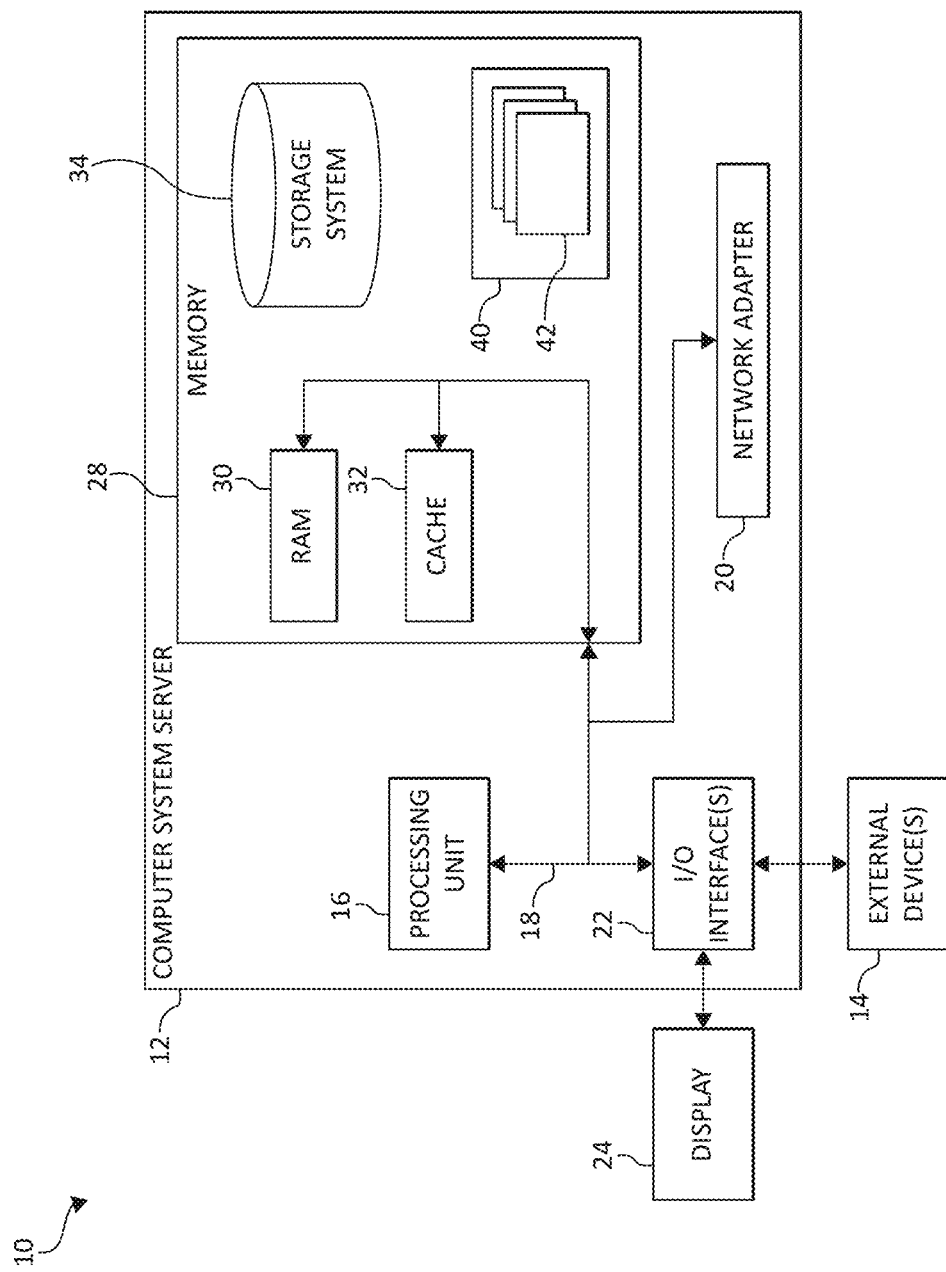
FIG. 1 is a block diagram depicting an exemplary cloud computing node according to an embodiment of the present invention.

The present invention relates generally to the field of electrical, electronic, and computer arts, and more specifically, to semiconductor Electronic Design Automation (EDA) and the like.

An integrated circuit (IC) is an electronic circuit formed using a semiconductor material, such as Silicon, as a substrate and by adding impurities to form solid-state electronic devices, such as transistors, diodes, capacitors, and resistors. Commonly known as a "chip" or a "package", an integrated circuit is generally encased in hard plastic, forming a "package". Moreover, the IC chip may include a large number of electronic components that are fabricated by layering several different materials on a silicon base or wafer. The design of an IC transforms a circuit description into a geometric description which is known as a layout. The process of converting the functional specifications of an electronic circuit into a layout is called the physical design. The objective of the physical design is to determine an optimal arrangement of devices in a plane or in a three-dimensional space, and an efficient interconnection or routing scheme between the devices to obtain the desired functionality.

The software tools used for designing ICs produce, manipulate, or otherwise work with the circuit layout and circuit components on very small scales. The designs produced and manipulated using these software tools are complex, often including hundreds of thousands of such components interconnected to form an intended electronic circuitry. A layout includes shapes that the designer selects and positions to achieve a design objective. The objective is to have the shape—the target shape—appear on the wafer as designed.

EDA involves the use of software tools for designing electronic systems such as, for example, the ICs and printed circuit boards. The EDA tools may rely on technical files with component macro relying on technical files. The component macro may include one or more macros. In one aspect, a macro defines a particular type, design structure/design hierarchy, entity, component, or element of an IC such as, for example, static random access memory, a memory management unit ("MMU"), and other standard logic circuitry. In other words, a design macro may be an entity, design structure, component, or element of an IC. In an additional aspect, macro may be a program that creates and analyzes a functional block of an integrated circuit. In this way, a macro may work on a file that includes the design for a particular function block of a section of a design. Thus, one macro can be operated on independent from of other macros.

One aspect of design is design rule checking or checks(s) ("DRC"). DRC is the area of electronic design automation that determines whether the physical layout of a particular chip layout satisfies a series of recommended parameters called design rules or "ground rules." Design rule checking is a major step during physical verification signoff on the design. Design rules may be predefined or learned (e.g., machine operations). Design rules may also be a series of parameters provided by semiconductor manufacturers that enable the designer to verify the correctness of a mask set. Design rules are specific to a particular semiconductor manufacturing process. A design rule set specifies certain geometric and connectivity restrictions to ensure sufficient margins to account for variability in semiconductor manufacturing processes, so as to ensure that the parts work correctly. For example, one design rule may be a width rule that specifies a minimum width of any shape (e.g., the minimum width of a threshold voltage (VT) shape used to define device performance) in the design. Another design rule may be a spacing rule that specifies a minimum distance between two adjacent shapes. The design rules may exist for each layer of a semiconductor manufacturing process. The main objective of DRC is to achieve a high overall yield and reliability for the design. If design rules are violated, the design may not be functional.

Moreover, the design rule (e.g., ground rules) are put in place to safeguard design process integrity while permitting efficient utilization of valuable design space. Achieving balance between the two aspects (e.g., integrity balanced with efficiency) often means ground rule values are defined or set at a point allowed by only the most aggressive design process capability. Additionally, ground rules may be defined based on one or more "process assumptions" before any IC (or wafer) data is available. As wafers are processed, it becomes of extreme importance and interest to verify these ground rule values actually represent a feasible process. Such verification requires a vehicle named Ground Rule Verification macros ("GRV").

As the semiconductor process technology advances into sub-10 nanometer ("nm") regime, cell pin accessibility, which is a complex joint effect from the pin shape and nearby blockages, becomes a main cause for Design Rule Violations (DRVs). Therefore, a machine learning model for DRV prediction needs to consider both very high-resolution pin shape patterns and low-resolution layout information as input features. A new convolutional neural network technique, "J-Net Plus", is introduced for the prediction with mixed resolution features. This is a customized architecture that is flexible for handling various input and output resolution requirements. Thus, the present invention employ J-Net networks to solve two problems at placement stage without using global routing information—DRV classification and regression. For the regression prediction, the present invention considers the randomness in labels caused by the nondeterministic parallel detailed routing, and address it by the focal likelihood loss function and the Gaussian random field layer technique.

Previous machine learning approaches to DRV prediction are usually formulated as a binary classification problem, i.e., only predicting whether DRVs will occur in each region, instead of regression that tells DRV density. DRV density provides more detailed information than binary classification in guiding DRV mitigation techniques. However, a multi-class classifier is very difficult to train with imbalanced data, which is often the case for DRV prediction. For instance, regions with DRVs accounts for only about 4% of entire layout area in several typical industrial designs that were used in our experiment. One challenge for DRV prediction is the randomness caused by parallel detailed routing. Another issue in DRV density prediction is the randomness in the distribution of DRVs, which in essence is brought by the randomness in parallel detailed routing.

In some implementations, the present invention may activate a machine learning operation to learn one or more features and data from a labeled dataset to predict the one or more DRVs; use one or more stochastic models to provide a spatial distribution of each of the one or more DRVs in the DRC density map; and provide a theoretical foundation depicting stochastic properties of the one or more DRVs in the DRC density map.

In some implementations, the present invention may apply a focal likelihood loss function to predict an intensity function in a layout space governing spatial distribution of the one or more DRVs in the DRC density map.

In some implementations, the present invention may apply a gaussian random field operation to provide dependency among intensity levels of the one or more DRVs in the DRC density map. In some implementations, the present invention may estimate the one or more DRVs in each tile of the DRC density map.

In this way, the architecture of the present invention executes using two tasks: 1) a classification-based DRC hotspot prediction, and 2) regression-based DRC heatmap prediction, such as, for example, in an IC chip designs at 7 nm process node. For DRC heatmap prediction, to address the randomness in labels, the present invention provides stochastic models for the spatial distribution of DRVs in the layout, based on which the focal likelihood loss ("FLL") function and the Gaussian Random Field ("RF") layer technique are developed to emphasize the stochastic properties of DRV distribution.

In general, as used herein, "optimize" may refer to and/or defined as "maximize," "minimize," "best," or attain one or more specific targets, objectives, goals, or intentions. Optimize may also refer to maximizing a benefit to a user (e.g., maximize a trained machine learning pipeline/model benefit). Optimize may also refer to making the most effective or functional use of a situation, opportunity, or resource.

Additionally, optimizing need not refer to a best solution or result but may refer to a solution or result that "is good enough" for a particular application, for example. In some implementations, an objective is to suggest a "best" combination of preprocessing operations ("preprocessors") and/ or machine learning models/machine learning pipelines, but there may be a variety of factors that may result in alternate suggestion of a combination of preprocessing operations ("preprocessors") and/or machine learning models yielding better results. Herein, the term "optimize" may refer to such results based on minima (or maxima, depending on what parameters are considered in the optimization problem). In an additional aspect, the terms "optimize" and/or "optimizing" may refer to an operation performed in order to achieve an improved result such as reduced execution costs or increased resource utilization, whether or not the optimum result is actually achieved. Similarly, the term "optimize" may refer to a component for performing such an improvement operation, and the term "optimized" may be used to describe the result of such an improvement operation.

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Referring now to FIG. 1, a schematic of an example of a cloud computing node is shown. Cloud computing node 10 is only one example of a suitable cloud computing node and is not intended to suggest any limitation as to the scope of use or functionality of embodiments of the invention described herein. Regardless, cloud computing node 10 is capable of being implemented and/or performing any of the functionality set forth hereinabove.

In cloud computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, computer system/server 12 in cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random-access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, system memory 28 may include at least one program product having a set (e.g., at least one) of program modules that are configured to carry out the functions of embodiments of the invention.

Program/utility 40, having a set (at least one) of program modules 42, may be stored in system memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

Figure 2:
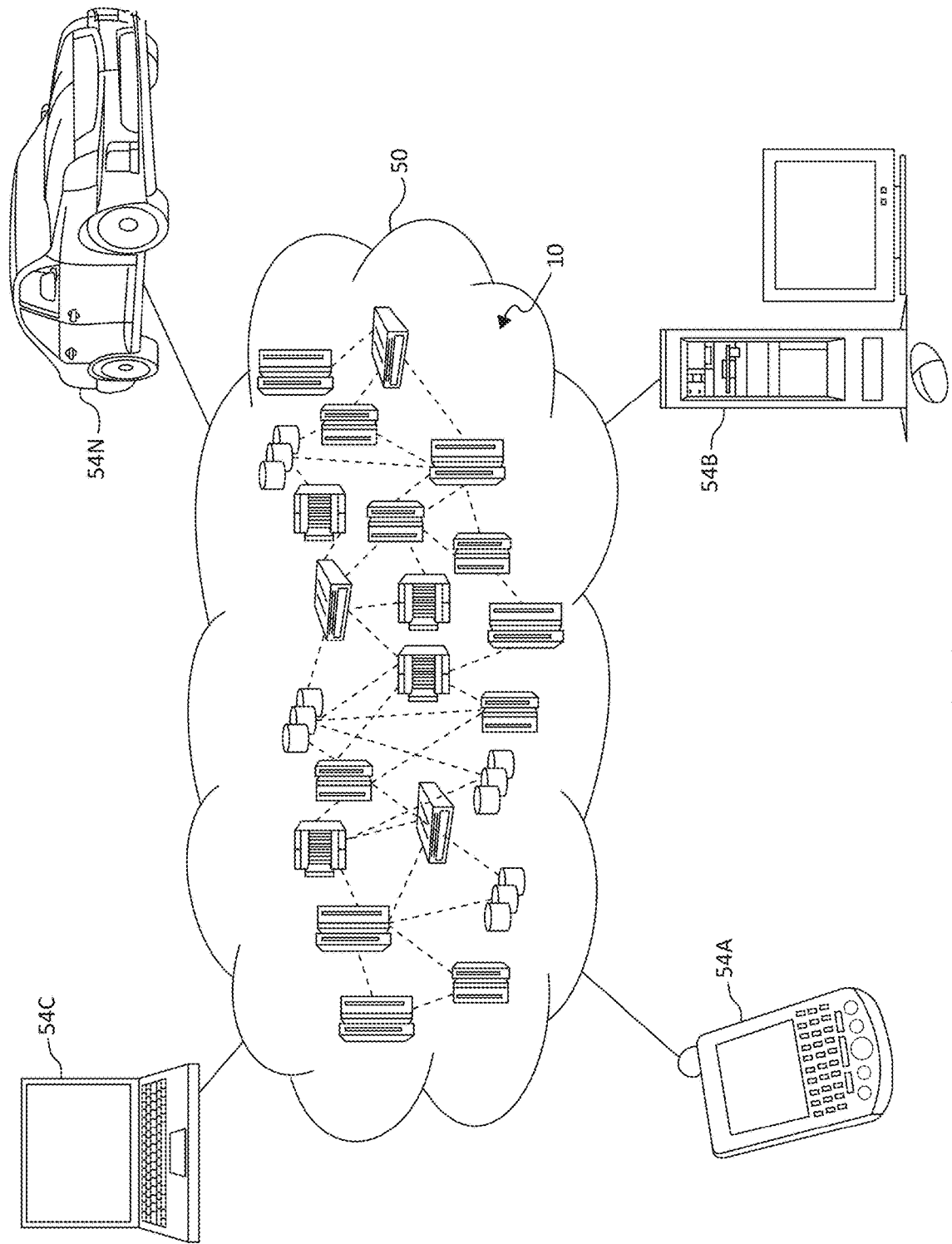
FIG. 2 is an additional block diagram depicting an exemplary cloud computing environment according to an embodiment of the present invention.

Referring now to FIG. 2, illustrative cloud computing environment 50 is depicted. As shown, cloud computing environment 50 comprises one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 2 are intended to be illustrative only and that computing nodes 10 and cloud computing environment 50 can communicate with any type of computerized device over any type of network and/or network addressable connection (e.g., using a web browser).

Figure 3:
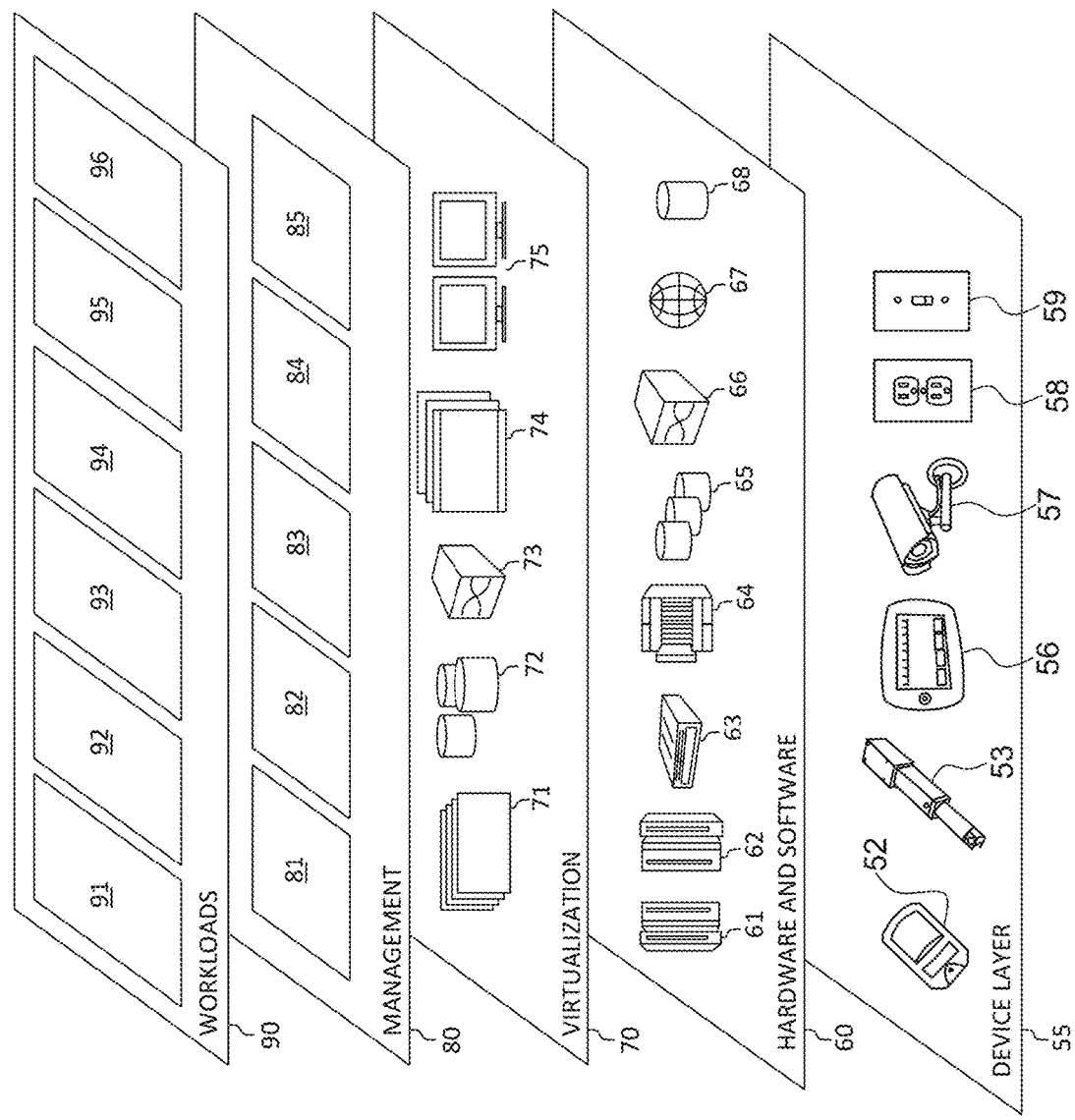
FIG. 3 is an additional block diagram depicting abstraction model layers according to an embodiment of the present invention.

Referring now to FIG. 3, a set of functional abstraction layers provided by cloud computing environment 50 (FIG. 2) is shown. It should be understood in advance that the components, layers, and functions shown in FIG. 3 are intended to be illustrative only and embodiments of the invention are not limited thereto. As depicted, the following layers and corresponding functions are provided:

Device layer 55 includes physical and/or virtual devices, embedded with and/or standalone electronics, sensors, actuators, and other objects to perform various tasks in a cloud computing environment 50. Each of the devices in the device layer 55 incorporates networking capability to other functional abstraction layers such that information obtained from the devices may be provided thereto, and/or information from the other abstraction layers may be provided to the devices. In one embodiment, the various devices inclusive of the device layer 55 may incorporate a network of entities collectively known as the "internet of things" (IoT). Such a network of entities allows for intercommunication, collection, and dissemination of data to accomplish a great variety of purposes, as one of ordinary skill in the art will appreciate.

Device layer 55 as shown includes sensor 52, actuator 53, "learning" thermostat 56 with integrated processing, sensor, and networking electronics, camera 57, controllable household outlet/receptacle 58, and controllable electrical switch 59 as shown. Other possible devices may include, but are not limited to various additional sensor devices, networking devices, electronics devices (such as a remote-control device), additional actuator devices, so called "smart" appliances such as a refrigerator or washer/dryer, and a wide variety of other possible interconnected objects.

Hardware and software layer 60 includes hardware and software components. Examples of hardware components include: mainframes 61; RISC (Reduced Instruction Set Computer) architecture-based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provides cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provides pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and, in the context of the illustrated embodiments of the present invention, various workloads and functions 96 for automatic generation of ground rule verification macros in a computing environment (e.g., in a neural network architecture). In addition, workloads and functions 96 for automatic generation of ground rule verification macros in a computing environment may include such operations as analytics, deep learning, and as will be further described, user and device management functions. One of ordinary skill in the art will appreciate that the workloads and functions 96 for automatic generation of ground rule verification macros in a computing environment may also work in conjunction with other portions of the various abstractions layers, such as those in hardware and software 60, virtualization 70, management 80, and other workloads 90 (such as data analytics processing 94, for example) to accomplish the various purposes of the illustrated embodiments of the present invention.

As previously mentioned, one challenge for DRV prediction is the randomness caused by parallel detailed routing. Another issue in DRV density prediction is the randomness in the distribution of DRVs, which in essence is brought by the randomness in parallel detailed routing.

Figure 4:
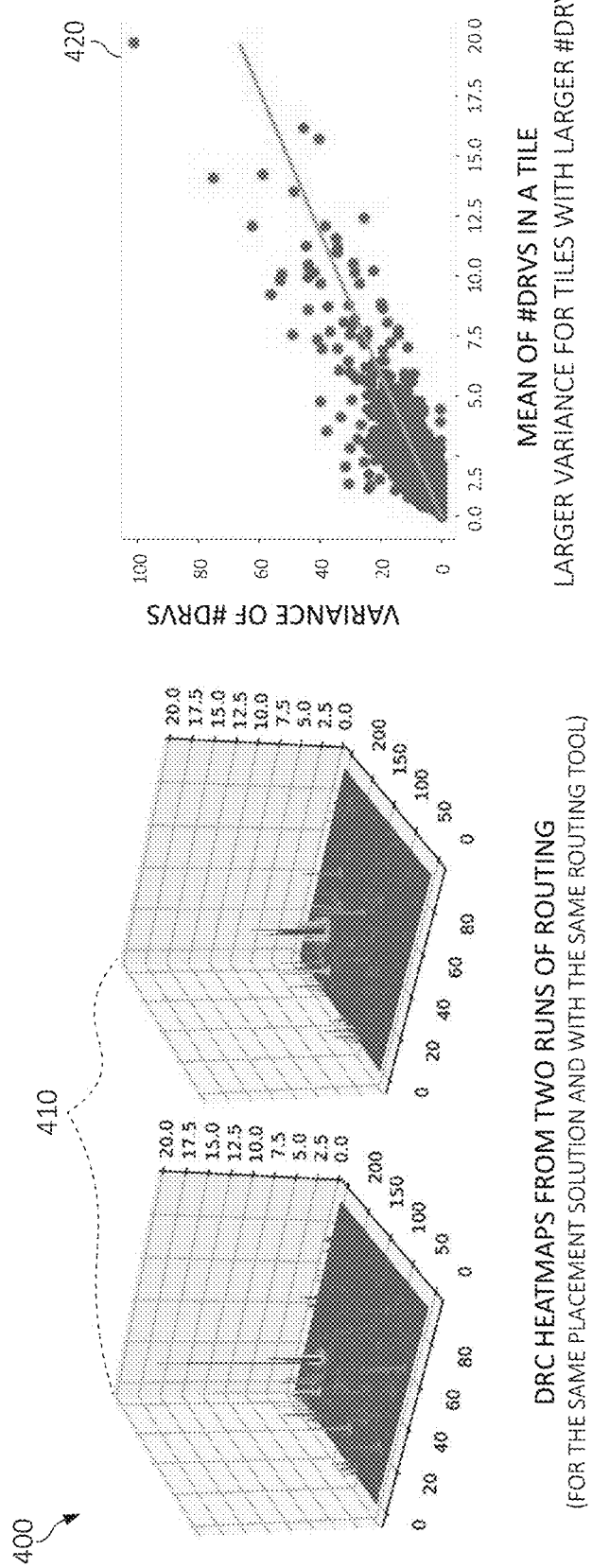
FIG. 4 is an additional block diagram depicting design rule violations from routing rounds for similar placement solutions with the same routing tool according to an embodiment of the present invention.

For example, as depicted in FIG. 4, DRV maps such as, for example, DRV maps 410 may depicted two routing solutions on the same placement generated by the same router and with the same setting may not be identical, though similar to each other. Also, results 420 depict a graph of a variance of the number of DRV's on a y-axis and the mean of the number of DRV in a tile of a DRV heatmap layout. That is, the results 420 depict a larger variance for tiles with a larger number of DRVs. From the model training aspect, such DRV maps 410 are very "noisy" labels. Even more complicated, the "noise" is not uniform. Instead, it depends on the DRV density.

Thus, as described herein, mechanisms of the illustrated embodiments provide for design rule check violations prediction of an integrated circuit in a computing environment, by one or more processors, in a computing system. One or more design rule violations ("DRVs") may be predicted using a design rule check ("DRC") density map during a physical synthesis operation prior to executing a routing operation.

Thus, to overcome these challenges, the present invention provides a novel solution using machine learning for predicting DRC hotspot and DRC heatmap at cell placement stage such as, for example, for sub-10 nm IC chip designs.

The machine learning operation can simultaneously take high resolution pin images and low-resolution placement information as input features. For DRC heatmap prediction, the present invention may identify the randomness issue in labels, and develop a focal likelihood loss and Gaussian random field layer based on stochastic models of DRV distribution. Using the focal likelihood loss and Gaussian random field layer operations, despite a dataset being highly-imbalanced and with large "noise" caused by the randomness issue, the present invention may provide more efficient and optimal DRC heatmap prediction results.

Figure 5:
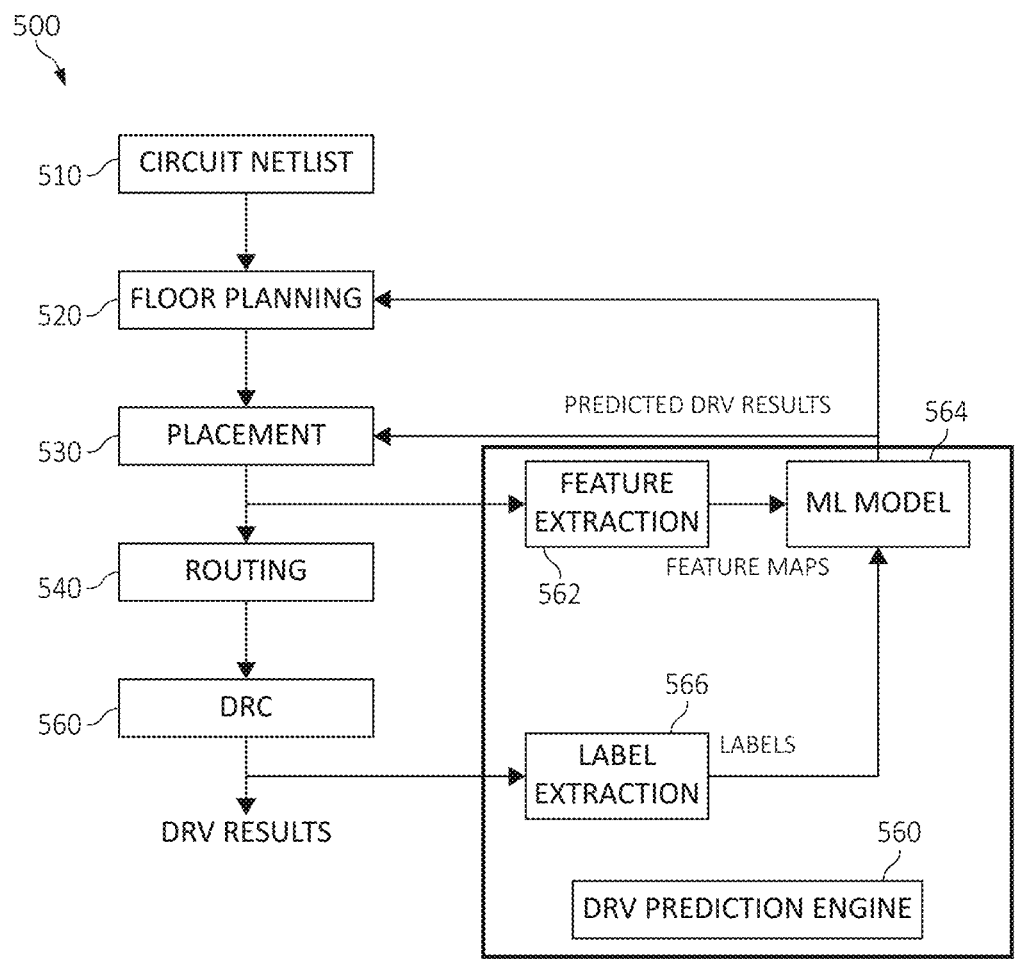
FIG. 5 is a flow diagram depicting an exemplary operations for providing design rule check violations prediction of an integrated circuit in which aspects of the present invention may be realized.

For further explanation, FIG. 5 is a flow diagram 500 depicting an exemplary operations for providing design rule check violations prediction of an integrated circuit in which aspects of the present invention may be realized. Additionally, the functionality of flow diagram 500 may be implemented as a method executed as instructions on a machine, where the instructions are included on at least one computer readable medium or one non-transitory machine-readable storage medium. Thus, a DRV prediction flow using a DRV prediction engine 560 of FIG. 5 may be implemented as a method executed as instructions on a machine, where the instructions are included on at least one computer readable medium or one non-transitory machine-readable storage medium.

As a preliminary matter, input features 562 may be extracted from a circuit netlist 510 and a placed layout 520 (e.g., placement), as in block 520. The layout 520 or "floorplan" is to place large macros (e.g., Ips), and placement is to place standard cells. After both floorplan and placement, all objects are placed, and the feature extraction works on all the placed objects.

One or more labels 566 may be extracted using a machine learning ("ML") model 564, from DRC routing results 560 based on the routing operation 540. To evaluate routability in terms of DRVs, a layout of a DRC heatmap may be tessellated into an array of uniform rectangular tiles such as, for example, uniform rectangular tiles that may be a l×l square[1]. Then, a rectangular layout with size W×H may be divided into w×h tiles, where w=W/l and h=H/l. The present invention targets at solving two DRV prediction tasks at the placement stage.

In one aspect, for DRC hotspot prediction, a binary DRC map $Y_{hotspot} \in \{0,1\}^{w \times h}$ may be predicted for each layout. Each entry in $Y_{hotspot}$ corresponds to one tile in the layout and "1" indicates there are DRVs in the tile and "0" indicates no DRV.

In an additional aspect, for DRC heatmap prediction. a real number map $Y_{heatmap} \in \{0,K\}^{w \times h}$ may be predicted for each layout, where K is the maximal number of DRVs in a tile[2] and each entry in $Y_{heatmap}$ represents the number of DRVs in a tile.

Thus, the DRV prediction engine 560 may be used to extract one or more features and provide one or more feature maps to the machine learning ("ML") models 564. The DRV prediction engine 560 may also extract one or more labels 566 and provide the labels 566 to the machine learning ("ML") models 564.

Figure 6A:
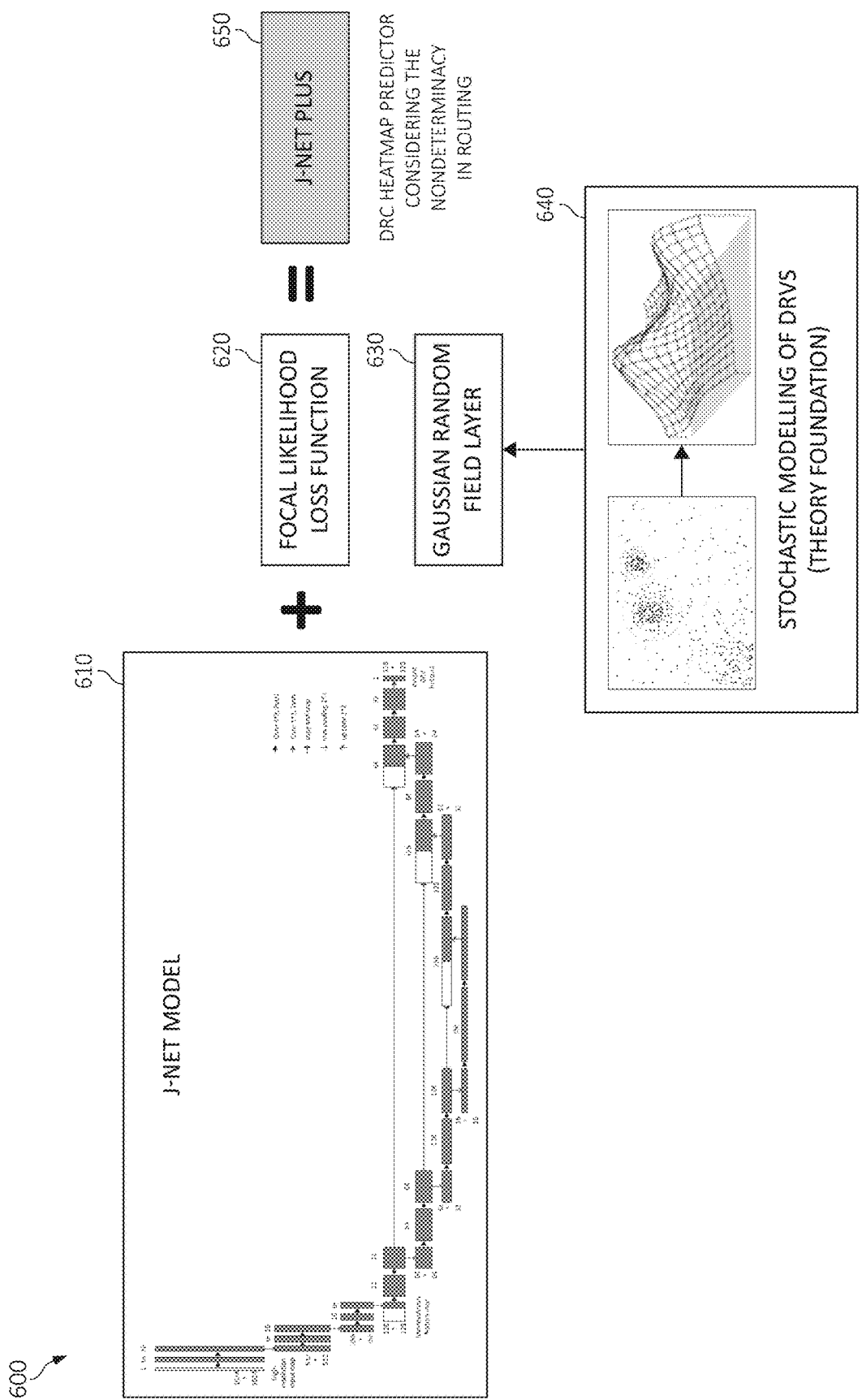
FIG. 6A-6B are block diagrams depicting an exemplary operations for providing design rule check violations prediction of an integrated circuit in which aspects of the present invention may be realized.
Figure 6B:
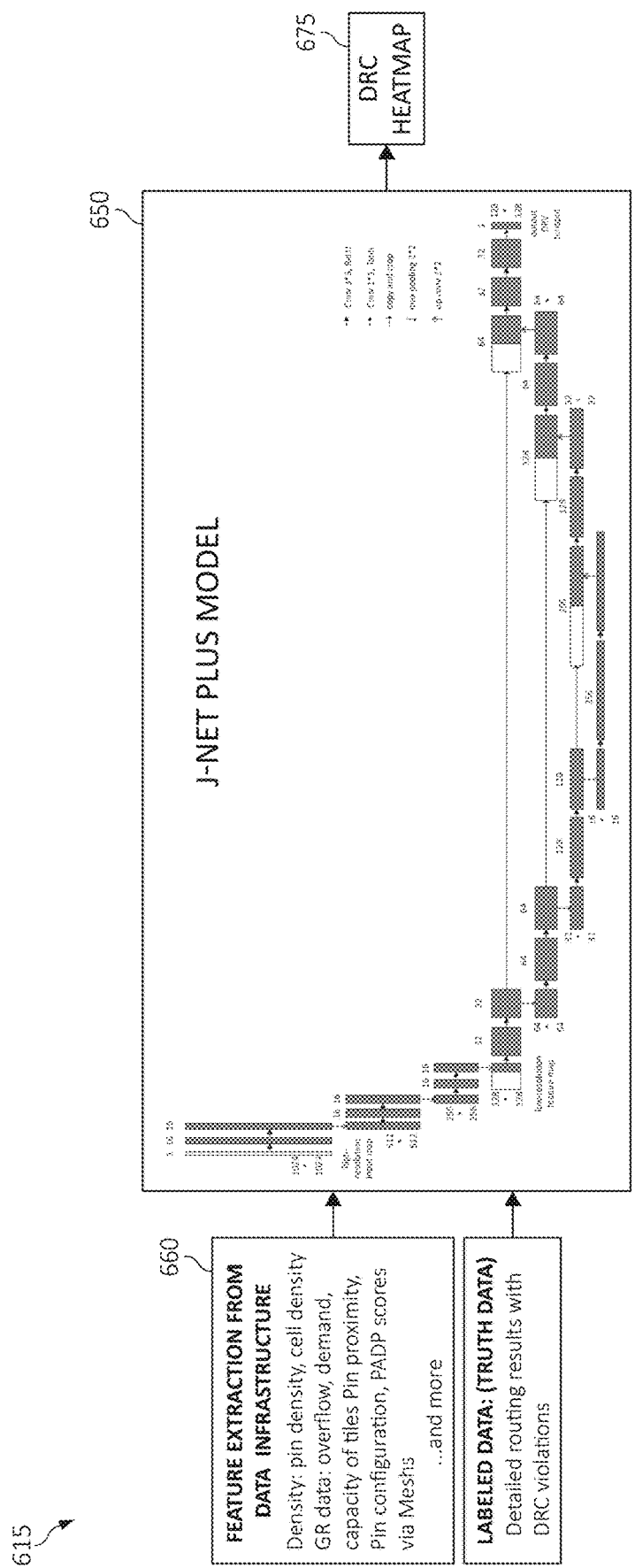

For further explanation, FIG. 6A-6B are block diagrams 600 and 615 depicting an exemplary operations for providing design rule check violations prediction of an integrated circuit in which aspects of the present invention may be realized. In one aspect, one or more of the components, modules, services, applications, and/or functions described in FIGS. 1-5 may be used in FIG. 6. As shown, various blocks of functionality are depicted with arrows designating the blocks' of systems 600 and 615 relationships with each other and to show process flow (e.g., steps or operations). Additionally, descriptive information is also seen relating each of the functional blocks' of systems 600 and 615.

As depicted in FIG. 6A, the present invention provides for stochastic modeling of DRVs for the DRC heatmap prediction. In block 610, a convolutional network architecture, J-Net, 610 may be used, which is a machine learning approach based on convolutional network DRV prediction technique that emphasizes pin accessibility and does not rely on global routing. The convolutional network architecture, J-Net, 610 may be used as opposed to a plugin use of existing machine learning engines. The convolutional network architecture, J-Net, 610 is used to address a mixed input resolution issue. The pin shape features for emphasizing pin accessibility has a resolution two orders of magnitude higher than other layout features such as pin density. Simply scaling low resolution features into high resolution would evidently cause inefficiency in computing. The convolutional network architecture, J-Net, 610 can be automatically tuned for various feature resolutions from different designs.

In some implementations, a focal likelihood loss function 620 and a Gaussian random field layer 630 may be added to the convolutional network architecture, J-Net, 610 to generate a convolutional network architecture, J-Net Plus, 650. The focal likelihood loss function 620 may be used to predict an intensity function in a layout space governing spatial distribution of the one or more DRVs in the DRC density map. The Gaussian random field layer 630 may be used to provide dependency among intensity levels of the one or more DRVs in the DRC density map.

In some implementations, stochastic models 640 may be used to provide a spatial distribution of each of the one or more DRVs in the DRC density map. Also, the stochastic models 640 may be used to provide theoretical foundation depicting stochastic properties of the one or more DRVs in the DRC density map.

In some implementations, for the DRC heatmap prediction, the randomness in the label caused by parallel detailed routing poses great challenges to model training. To deal with the randomness issue, the stochastic models 640 may be used for the spatial distribution of DRVs in a layout, based on which two techniques emphasizing the stochastic properties of DRV distribution, and then integrate the two operations with convolutional network architecture, J-Net, 610 based regression models.

In some implementations, for the stochastic models 640 of DRVs, the spatial distribution of DRVs may be modeled in a layout as a heterogeneous Poisson point process on a discrete two dimensional space, which is characterized by the intensity function $\mu(i; j)$ over $1 \leq i \leq w$ and $1 \leq j \leq h$, where $\mu(i; j)$ represents the DRV intensity in the $(i; j)$th tile of the layout. As used herein, "heterogeneous" means the $\mu(i; j)$ varies at different $(i; j)$.

According to a property of a Poisson point process, a number of DRVs occurring in the $(i; j)$th tile obeys a Poisson distribution with parameter $\mu(i; j)$ and $\mu(i; j)$ also represents the expected number of DRVs occurring in the tile of the layout. The Poisson point process is a simplification of the real scattering patterns of DRVs, in the sense that it assumes "no interaction" between DRVs, while the spatial point patterns of DRVs usually exhibit some degree of clustering. Such clustering pattern will lead to a phenomenon that tiles near to each other tend to have similar DRV intensity.

In some implementations, a Gaussian RF may be used to capture the dependency among the DRV intensity of tiles. The Gaussian RF can be implemented efficiently as an additional network layer that can be added to the J convolutional network architecture, J-Net, 610.

In some implementations, for the focal likelihood loss function 620, instead of directly predict the number of DRVs in tiles of a layer of the DRC heatmap, the present invention predicts an intensity function $\mu$ in the layout space that governs the spatial distribution of DRVs. The "noisy" label collected from one round of routing is regarded as one sample generated according to the spatial distribution of DRVs. However, unlike mean squared error ("MSE")-based loss functions penalizing prediction results according to the absolute prediction errors, the focal likelihood loss function 620 calculates loss.

In some implementations, a predicted DRC heatmap and a real DRC map may be denoted as $Y \in R^{w \times h}$ and $L \in N^{w \times h}$, where N is the set of non-negative integers. The focal likelihood loss function 620 (e.g., FLL) may having the following equations:

$$FLL(Y, L) = -\frac{1}{wh} \sum_{(i,j)} (1 - P(i, j)) \log((P(i, j) + \varepsilon)), \quad (9)$$

$$P(i, j) = \frac{Y(i, j)^{L(i,j)} e^{-Y(i,j)}}{L(i, j)!}, \quad (10)$$

where £ is a small positive number and $\log(i,j)$ is a sample generated from a Poisson distribution with parameter $Y(i; j)$, which will guide the prediction result $Y(i; j)$ to a solution with high likelihood. The first term $1-P(i,j)$ is the focal loss term, which will down-weight samples adaptively during training. The $P(i; j)$ close to a value of "1" means that the sample is well-predicted, which helps address imbalanced data. As $P(i; j)!$ goes to the value of 1, the focal likelihood loss function 620 (e.g., FLL) term goes to 0 and the loss for well-predicted samples is down-weighted. The $\log(P(i,j))$ is the likelihood term and penalizes prediction results based on a likelihood or probability, which helps address the DRV-density dependent noise. It should be noted that the purpose of likelihood loss function 620 (e.g., FLL) is to handle unbalanced data. For example, tile A is 0, but the prediction is 1; tile B is 9, but the prediction is 10. The prediction error is the same, both are 1. However, the second case (case 2) is a better case than the first case (case 1). In this example, the likelihood loss function 620 (e.g., FLL) will penalize the first case more. In other words, the likelihood loss function 620 (e.g., FLL) gives less weight (down-weighted) in loss function for case 2.

By applying the focal likelihood loss function 620, an imbalanced dataset may be processed. That is, one of the characteristics of the focal likelihood loss function 620 is that the focal likelihood loss function 620 penalizes (e.g., punishes) the prediction result according to a likelihood of errors, rather than absolute errors. Thus, consider the following two examples.

In the first case, the predicted intensity $Y(i,j)$ equals 0, while the number of DRV (e.g., "#DRV") labels in this tile of the layout, the loss (e.g., $L(i,j)$) is 1. In the other case, the predicted intensity $Y(i,j)$ equals equation 9, while the number of DRV label equals equation 10. Because the absolute prediction errors in both cases are 1, the MSE-based loss functions may produce the same loss for both cases. However, in the alternative, the focal likelihood loss function 620 may penalize the first case much more heavily, since k=1, which cannot happen in a Poisson distribution with parameter 0.

As shown in FIG. 4, above, the absolute difference between two different routing solutions for the same design is larger in regions with higher DRV density. As such, the present invention provides for increased tolerance for larger absolute prediction errors for tiles with higher DRVs density, which the focal likelihood loss function 620 can handle such requirements.

To reduce runtime overhead during training, the present invention may pre-calculate log(k!) for $0 \leq k \leq K$ before training, where K is the maximum number of DRVs in a tile of the two-dimensional layout of the DRV heatmap. The log-likelihood can be calculated as follows:

$$\log(P(i,j)) = L(i,j)\log(Y(i,j)) - Y(i,j) - \log(L(i,j)!) \quad (11),$$

where $\log(L(i,j)!)$ is obtained such as, for example, a database, a machine learning model, and/or via a look-ups table.

Additionally, the Gaussian random field layer 630 may be added to the J-Net architecture as a final/last layer to capture the correlation among the DRV intensity of tiles.

In some implementations, for implementing the Gaussian random field layer 630, weighting factor $\beta$ and the similarity measure $S_{ij}$ may be learned and/or defined. The weighting factor $\beta$ may be implemented as a learnable parameter. The similarity measure $S_{ij}$ may be defined based on the proximity of two tiles. Three similarity measures $S_{ij}$ as follows may be use:

$$S1: Sij = \begin{cases} 1 & \text{if } dis(i,j) = 1 \\ 0 & \text{otherwise} \end{cases}$$

$$S2: Sij = \begin{cases} 1 & dis(i,j) = 1, 2, \text{ or } 3 \\ 0 & i = j \end{cases}$$

$$S3: Sij = \begin{cases} 1 & \exp\{-dis(i,j)/\sigma \quad i \neq j \\ 0 & i = j \end{cases}$$

where dis(i,j) denotes a Manhattan Distance between two tiles, and $\sigma$ is a learnable variable. With the Gaussian random field layer, the training of regression models becomes a two-stage process, such as described in FIG. 9. At a first stage, the Gaussian random field layer 630 (e.g., the Gaussian random field model) is not added to the model, and a J-Net part is trained solely to output unstructured prediction. At a second stage, the parameters of the J-Net part are fixed and the Gaussian random field layer 630 is added to a model as a last layer and trained to give structured output. The two-stages training process provides for easier convergence to an optimal solution as compared with training an entire regression model with Gaussian random field layer 630 in one stage.

As depicted in FIG. 6B, the present invention provides for a prediction flow for the DRC heatmap prediction. That is, for the DRC heatmap prediction, a machine learning operation 660 may be performed to extract one or more features from data such as, for example, the density (e.g., pin density, cell density), a Gaussian random data (e.g., overflow, demand, and capacity of tiles), pin proximity (e.g., pin configuration, and PADP scores), and the other data. Also, data may be labeled (e.g., labeled data/truth data) such as, for example, detailed routing results with DRC violations. A J-Net plus model 650 may be use the features and the labels from the machine learning operation 660 to generate a DRC heatmap. Thus, improvements are provided over J-net such as, for example, the J-Net plus model 650 outputs a heatmap estimating a number of DRVs in each tile while a J-Net Model outputs a Boolean map predicting which tile has DRVs. Also, the J-Net plus model 650 takes tool randomness into consideration while a J-Net Model only handles deterministic data.

Figure 7:
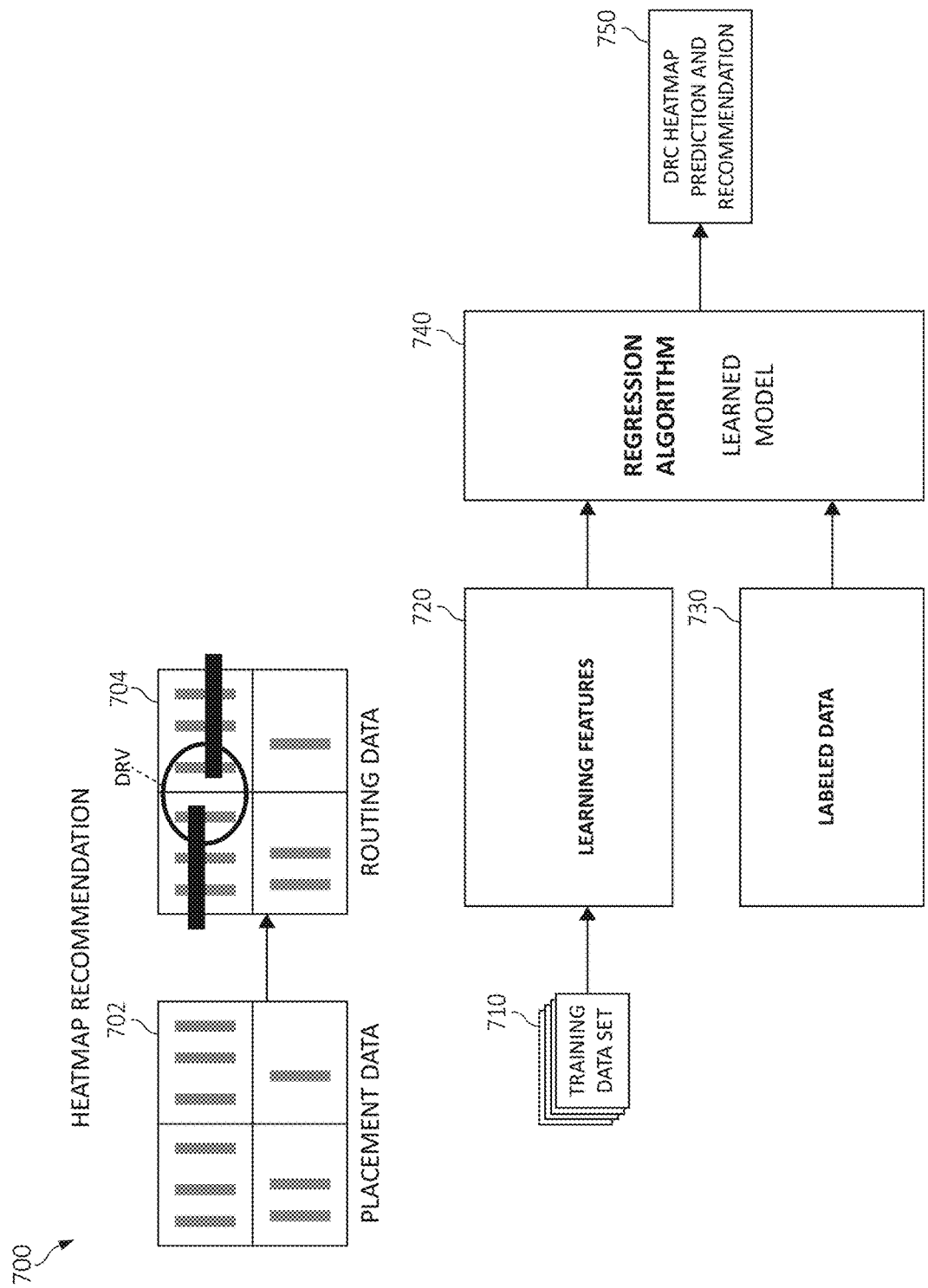
FIG. 7 is block diagram depicting an exemplary operations for providing design rule check violations prediction of an integrated circuit in which aspects of the present invention may be realized.

For further explanation, FIG. 7 is block flow diagram 700 depicting an exemplary operations for providing design rule check violations prediction of an integrated circuit in which aspects of the present invention may be realized. In one aspect, one or more of the components, modules, services, applications, and/or functions described in FIGS. 1-6 may be used in FIG. 7. For example, computer system/server 12 of FIG. 1, incorporating processing unit 16, may be used to perform various computational, data processing and other functionality described in FIG. 7.

As depicted, the operations for providing design rule check violations prediction, may include accessing, receiving, and/or analyzing a training data set 710. In block 720, one or more learning features may be extracted. In block 730, labeled data may be extracted. Both the learning features and the labeled data may be applied and used in a machine learning operation 740 such as, for example, a regression algorithm (e.g., a learned model). A DRC heatmap prediction and recommendation may be provided, as in block 750.

Thus, the placement data 702 may be used for the DRC heatmap prediction and recommendation such that the DRV occurrences are identified without the routing data via a DRC heatmap prediction and recommendation. The routing data 704 is needed to guide the machine learning model. That is, the routing 704 is expensive and the prediction work is to avoid calling for the routing but obtain the same/similar DRV count. Hence, the machine learning model is trained to estimate DRVs without routing. During the model training stage, the routing data 704 is needed to guide the model. Once the training is completed, the machine learning model can be applied to new designs to predict DRVs without the routing.

Figure 8:
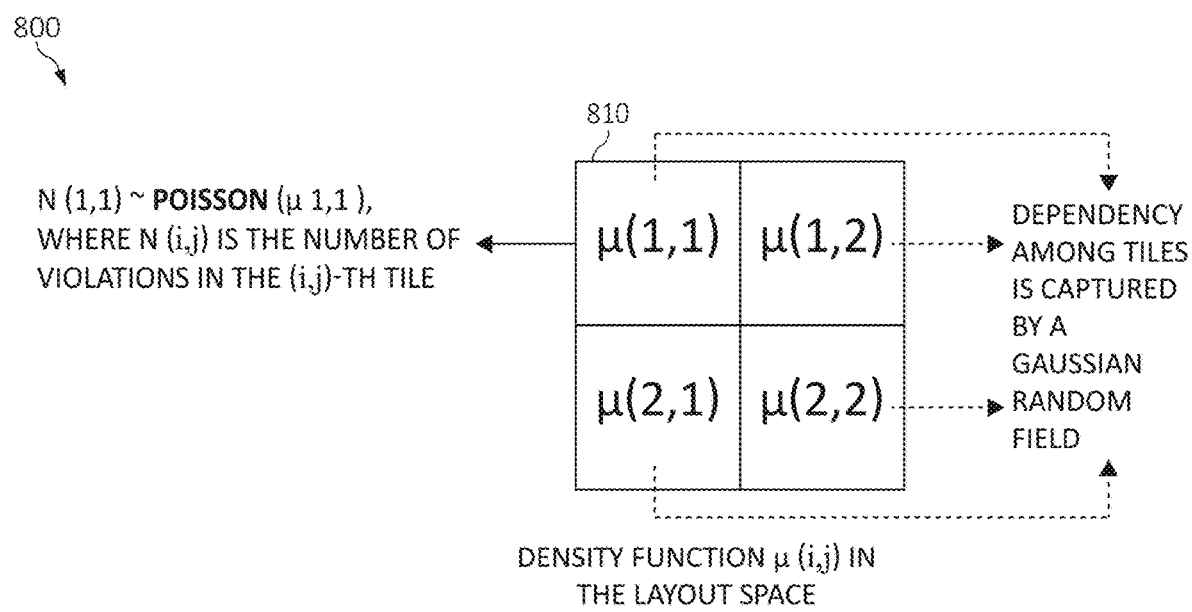
FIG. 8 is block diagram depicting an exemplary operations for stochastic modeling of design rule violations in which aspects of the present invention may be realized.

For further explanation, FIG. 8 is block diagram 800 depicting an exemplary operations for stochastic modeling of design rule violations in which aspects of the present invention may be realized.

In one aspect, the block diagram 800 depicts stochastic modeling of DRV with a Poisson point access and a Gaussian random field. The stochastic modeling lays a theoretical foundation to address stochastic properties of DRVs caused by the non-deterministic routing. That is, stochastic model has a optimal or ideal fit to the actual distribution of DRVs and has some maximized mathematical properties. The stochastic model provides theoretical support for a deep-learning model.

As depicted, a density function $\mu(i; j)$ in four tiles of a layout space of a DRC heatmap is depicted showing $\mu(1, 1)$, $\mu(1, 2)$, $\mu(2, 1)$, and $\mu(2, 2)$. In some implementations, N(1, 1) is approximately Poisson ($\mu(1, 1)$), where N(i; j) is the number of violation sin the (i; j)th tile. Also, dependency among the tiles may be captures by a Gaussian random field.

Figure 9:
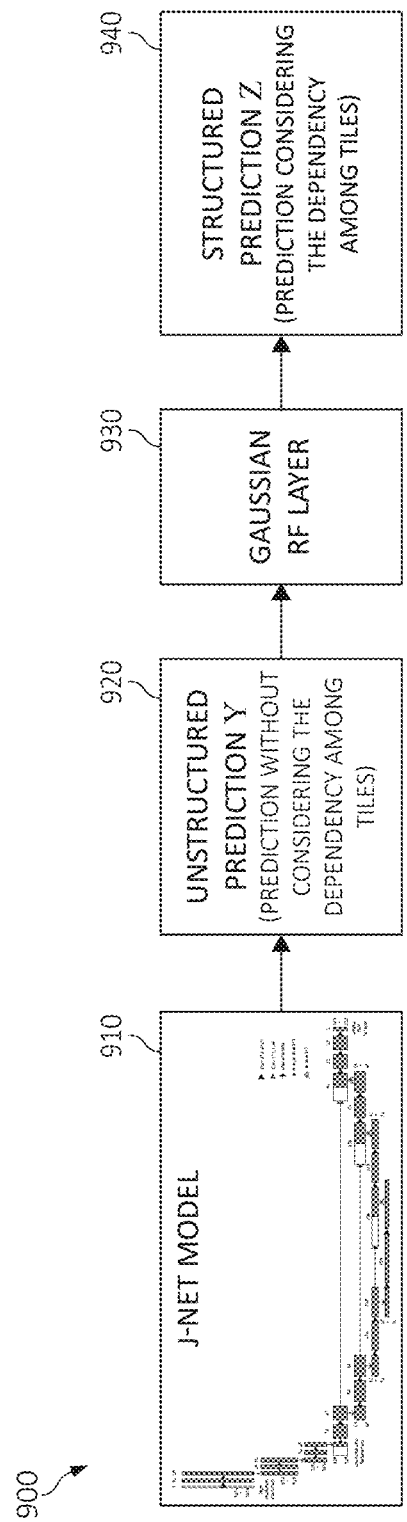
FIG. 9 is block diagram depicting an exemplary operations for applying a gaussian random field layer in which aspects of the present invention may be realized.

For further example, FIG. 9 is block diagram depicting an exemplary operations for applying a gaussian random field layer in which aspects of the present invention may be realized.

In some aspects, training of regression models becomes a two-stage process. At a first stage, a Gaussian random field layer 930 (e.g., the Gaussian random field model) is not added to a J-Net model, and a J-Net part is trained solely to output unstructured prediction. That, is the J-Net model 910 generates an unstructured prediction Y (e.g., a prediction without considering any dependency among tiles in a DRC heatmap). At a second stage, the parameters of the J-Net model 910 part are fixed and the Gaussian random field layer 930 is added to the J-Net model 910 as a last layer and trained to give structured output 940 (e.g., a structured prediction Z). That is, the structured output 940 is a prediction that considers each dependency among tiles in a DRC heatmap. The two-stages training process provides for easier convergence to an optimal solution as compared with training an entire regression model with Gaussian random field layer 930 in one stage.

Figure 10:
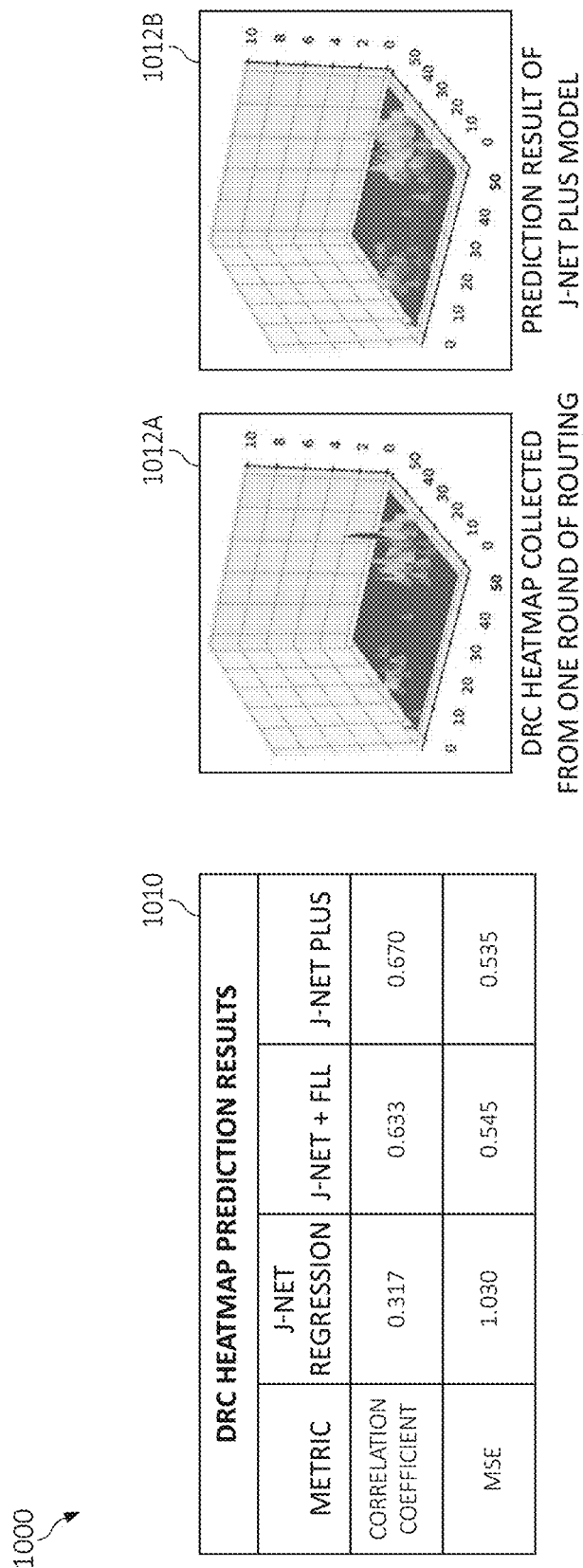
FIG. 10 is diagram depicting operations prediction results from providing design rule check violations prediction of an integrated circuit in which aspects of the present invention may be realized.

For further explanation, FIG. 10 is diagram 1000 depicting operations prediction results from providing design rule check violations prediction of an integrated circuit in which aspects of the present invention may be realized.

That is, FIG. 10 illustrates operations and data preparations for DRC heatmap prediction results displayed in table 1010 and the DRC heatmaps 1012A depicting one round of routing and the DRC heatmap 1012B depicting prediction results of the J-Net Plus model.

For the data preparations, by way of example only, 102 placements from 6 P10 designs are used with 82 placements for training and validating-data augmentation (e.g., cutting, random flipping), and 20 placements for testing. One or more various input features may be used. The results depicts comparisons of 1) a J-Net Regression model, which is a J-Net regression model and shrinkage loss (e.g., a regression loss emphasizing imbalanced dataset), 2) a J-Net model and a focal likelihood loss ("FLL"), which is a J-Net regression model and a proposed focal likelihood loss, and 3) is a J-Net Plus operation where a J-Net regression model, the proposed focal likelihood loss, and the Gaussian RF layer is used.

For further explanation, FIG. 11 is diagram depicting a table 1100 of prediction result from providing design rule check violations prediction of an integrated circuit in which aspects of the present invention may be realized. That is, table 1100 depicts a comparison of the J-Net Plus operation of the present invention sing the regression results of J-Net Plus operation for three-class classification via setting thresholds to the regression output. The -Net Plus operation is compared with a J-Net Multi-Class Classifier, where training a J-Net three-class classifier with weighted loss function (a popular classification loss emphasizing imbalanced dataset). Multi-class classification results are depicted in table 1100 showing a confusion matrix and class accuracy.

Figure 12:
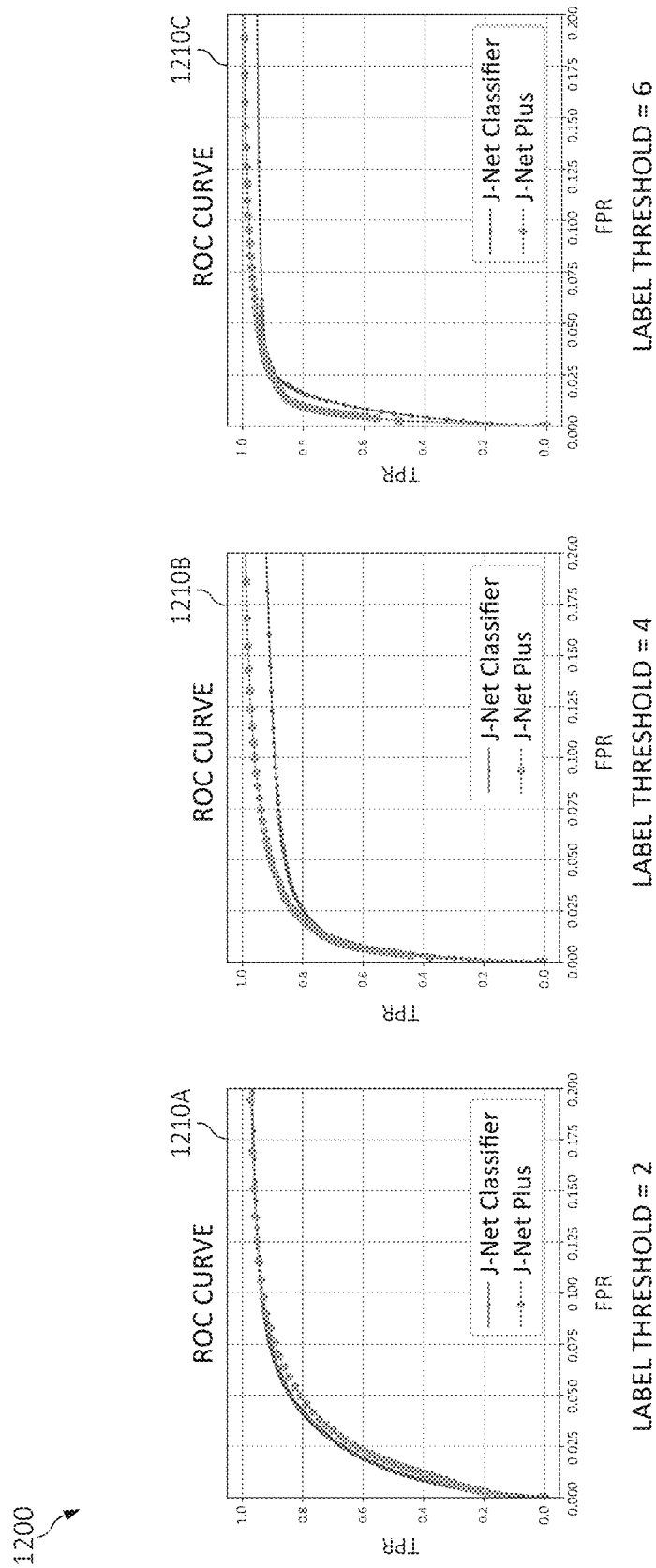
FIG. 12 is a diagram of ROC curves for various binary-classification methods at different label threshold in which aspects of the present invention may be realized.

For further explanation, FIG. 12 is a diagram of ROC curves for various binary-classification methods at different label threshold in which aspects of the present invention may be realized. As depicted, for DRC Heatmap Results, regression results for binary classification ROC curves 1210A-C of various binary classification methods with various threshold 2, 4 or 6. That is, the proposed J-Net Plus may use regression results of J-Net Plus operation for binary classification via setting thresholds to the regression output. A J-Net classifier may be used to train a J-Net binary classifier for each label threshold. The J-Net Plus operation can train a regression model once and obtain classification results for various label thresholds. The J-Net classifier needs to retrain for each threshold.

Figure 13:
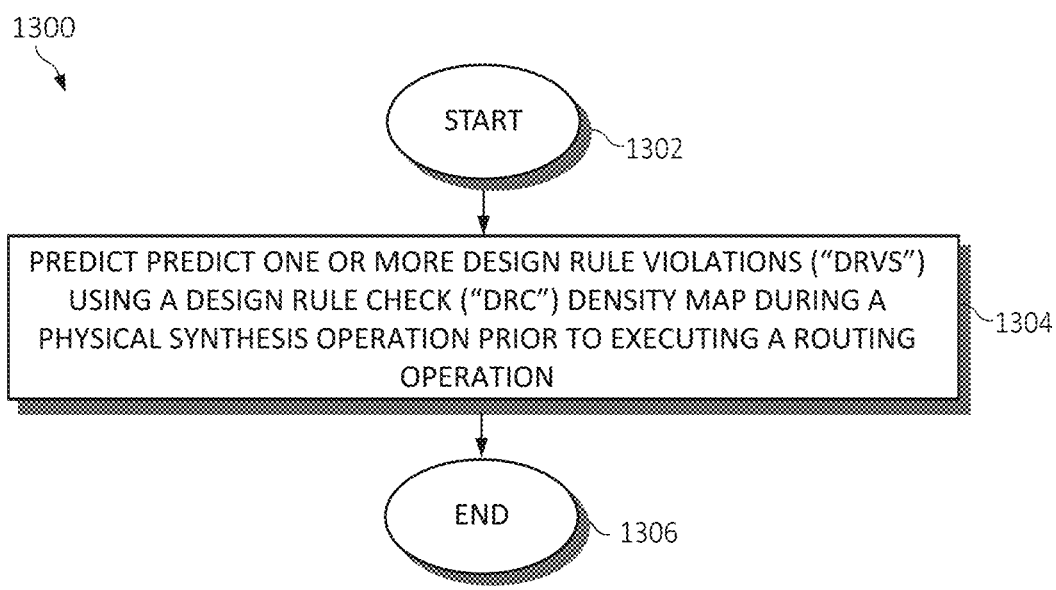
FIG. 13 is a flowchart diagram depicting an exemplary method for providing design rule check violations prediction of an integrated circuit by a processor, again in which aspects of the present invention may be realized.

Turning now to FIG. 13, a method 1300 for managing regulatory compliance for an entity using a processor is depicted, in which various aspects of the illustrated embodiments may be implemented. The functionality 1300 may be implemented as a method executed as instructions on a machine, where the instructions are included on at least one computer readable medium or one non-transitory machine-readable storage medium. The functionality 1300 may start in block 1302.

One or more design rule violations ("DRVs") may be predicted using a design rule check ("DRC") density map during a physical synthesis operation prior to executing a routing operation, as in block 1304. The functionality 1300 may end, as in block 1306.

In one aspect, in conjunction with and/or as part of at least one blocks of FIG. 13, the operation of method 1300 may include each of the following. The operations of 1300 may activate a machine learning operation to learn one or more features and data from a labeled dataset to predict the one or more DRVs. The operations of 1300 may use one or more stochastic models to provide a spatial distribution of each of the one or more DRVs in the DRC density map. The operations of 1300 may provide a theoretical foundation depicting stochastic properties of the one or more DRVs in the DRC density map. The operations of 1300 may apply a focal likelihood loss function to predict an intensity function in a layout space governing spatial distribution of the one or more DRVs in the DRC density map. The operations of 1300 may apply a gaussian random field operation to provide dependency among intensity levels of the one or more DRVs in the DRC density map. The operations of 1300 may estimate the one or more DRVs in each tile of the DRC density map The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowcharts and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowcharts and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowcharts and/or block diagram block or blocks.

The flowcharts and block diagrams in the Figures illustrate the architecture, functionality, and operation of possible implementations of systems, methods, and computer program products according to various embodiments of the present invention. In this regard, each block in the flowcharts or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts or carry out combinations of special purpose hardware and computer instructions.

The descriptions of the embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for providing design rule check violations prediction in a computing environment by one or more processors comprising:
    predicting one or more design rule violations ("DRVs") using a design rule check ("DRC") density map during a physical synthesis operation prior to executing a routing operation;
    determining dependency of DRV intensity of tiles based on a gaussian random field layer;
    evaluating using stochastic models, a spatial distribution of the DRVs in a layout;
    developing, based on the evaluating, a theoretical foundation to address stochastic properties of violations caused by a non-deterministic routing, and
    deploying a focal likelihood loss function to address the non-deterministic routing based on the stochastic models.

2. The method of claim 1, further including activating a machine learning operation to learn one or more features and data from a labeled dataset to predict the one or more DRVs.

3. The method of claim 1, further including using one or more stochastic models to provide a spatial distribution of each of the one or more DRVs in the DRC density map.

4. The method of claim 1, further including providing a theoretical foundation depicting stochastic properties of the one or more DRVs in the DRC density map.

5. The method of claim 1, further including applying a focal likelihood loss function to predict an intensity function in a layout space governing spatial distribution of the one or more DRVs in the DRC density map.

6. The method of claim 1, further including applying a gaussian random field operation to provide dependency among intensity levels of the one or more DRVs in the DRC density map.

7. The method of claim 1, further including estimating the one or more DRVs in each tile of the DRC density map.

8. A system for providing design rule check violations prediction in a computing environment, comprising:
one or more computers with executable instructions that when executed cause the system to:
predict one or more design rule violations ("DRVs") using a design rule check ("DRC") density map during a physical synthesis operation prior to executing a routing operation;
determining dependency of DRV intensity of tiles based on a gaussian random field layer;
evaluating using stochastic models, a spatial distribution of the DRVs in a layout,
developing, based on the evaluating, a theoretical foundation to address stochastic properties of violations caused by a non-deterministic routing, and
deploying a focal likelihood loss function to address the non-deterministic routing based on the stochastic models.

9. The system of claim 8, wherein the executable instructions when executed cause the system to activate a machine learning operation to learn one or more features and data from a labeled dataset to predict the one or more DRVs.

10. The system of claim 8, wherein the executable instructions when executed cause the system to use one or more stochastic models to provide a spatial distribution of each of the one or more DRVs in the DRC density map.

11. The system of claim 8, wherein the executable instructions when executed cause the system to provide a theoretical foundation depicting stochastic properties of the one or more DRVs in the DRC density map.

12. The system of claim 8, wherein the executable instructions when executed cause the system to apply a focal likelihood loss function to predict an intensity function in a layout space governing spatial distribution of the one or more DRVs in the DRC density map.

13. The system of claim 8, wherein the executable instructions when executed cause the system to apply a gaussian random field operation to provide dependency among intensity levels of the one or more DRVs in the DRC density map.

14. The system of claim 8, wherein the executable instructions when executed cause the system to estimate the one or more DRVs in each tile of the DRC density map.

15. A computer program product for providing design rule check violations prediction in a computing environment, the computer program product comprising:
one or more computer readable storage media, and program instructions collectively stored on the one or more computer readable storage media, the program instruction comprising:
program instructions to predict one or more design rule violations ("DRVs") using a design rule check ("DRC") density map during a physical synthesis operation prior to executing a routing operation;
determining dependency of DRV intensity of tiles based on a gaussian random field layer,
evaluating using stochastic models, a spatial distribution of the DRVs in a layout;
developing, based on the evaluating, a theoretical foundation to address stochastic properties of violations caused by a non-deterministic routing; and
deploying a focal likelihood loss function to address the non-deterministic routing based on the stochastic models.

16. The computer program product of claim 15, further including program instructions to activate a machine learning operation to learn one or more features and data from a labeled dataset to predict the one or more DRVs.

17. The computer program product of claim 15, further including program instructions to:
use one or more stochastic models to provide a spatial distribution of each of the one or more DRVs in the DRC density map; and
provide a theoretical foundation depicting stochastic properties of the one or more DRVs in the DRC density map.

18. The computer program product of claim 15, further including program instructions to apply a focal likelihood loss function to predict an intensity function in a layout space governing spatial distribution of the one or more DRVs in the DRC density map.

19. The computer program product of claim 15, further including program instructions to apply a gaussian random field operation to provide dependency among intensity levels of the one or more DRVs in the DRC density map.

20. The computer program product of claim 15, further including program instructions to estimate the one or more DRVs in each tile of the DRC density map.

* * * * *